(12) United States Patent
Hsu

(10) Patent No.: US 12,107,102 B2
(45) Date of Patent: *Oct. 1, 2024

(54) ANTI-FLARE SEMICONDUCTOR PACKAGES AND RELATED METHODS

(71) Applicant: SEMICONDUCTOR COMPONENTS INDUSTRIES, LLC, Scottsdale, AZ (US)

(72) Inventor: Shou-Chian Hsu, Zhubei (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,296

(22) Filed: Aug. 1, 2023

(65) Prior Publication Data

US 2023/0378208 A1 Nov. 23, 2023

Related U.S. Application Data

(63) Continuation of application No. 17/305,616, filed on Jul. 12, 2021, now Pat. No. 11,756,973, which is a
(Continued)

(51) Int. Cl.
*H01L 27/146* (2006.01)
*H01L 21/56* (2006.01)
*H01L 23/00* (2006.01)

(52) U.S. Cl.
CPC .. *H01L 27/14623* (2013.01); *H01L 27/14618* (2013.01); *H01L 27/14636* (2013.01);
(Continued)

(58) Field of Classification Search
CPC ......... H01L 27/14623; H01L 27/14618; H01L 27/14636; H01L 27/14685;
(Continued)

(56) References Cited

U.S. PATENT DOCUMENTS 7,576,401 B1 8/2009 de Guzman et al.
11,063,078 B2 7/2021 Hsu
(Continued)

OTHER PUBLICATIONS

Lin, et al., Encapsulated Wafer Level Chip Scale Package (eWLCSP) for Cost Effective and Robust Solutions in FlexLine, 2014 IEEE International Microsystems, Packaging, Assembly and Circuits Technology Conference (IMPACT), 2014, 5 pages.

*Primary Examiner* — Caleen O Sullivan
(74) *Attorney, Agent, or Firm* — Adam R. Stephenson, LTD.

(57) ABSTRACT

Implementations of semiconductor packages may include: a semiconductor die having a first side and a second side. A first side of an optically transmissive lid may be coupled to the second side of the semiconductor die through one or more dams. The packages may also include a light block material around the semiconductor package extending from the first side of the semiconductor die to a second side of the optically transmissive lid. The package may include an opening in the light block material on the second side of the optically transmissive lid that substantially corresponds with an active area of the semiconductor die.

20 Claims, 3 Drawing Sheets

Related U.S. Application Data continuation of application No. 16/456,917, filed on Jun. 28, 2019, now Pat. No. 11,063,078.

(52) U.S. Cl.
CPC .. *H01L 27/14685* (2013.01); *H01L 27/14687* (2013.01); *H01L 21/56* (2013.01); *H01L 24/95* (2013.01)

(58) Field of Classification Search
CPC ... H01L 27/14687; H01L 21/56; H01L 24/95; H01L 2224/13; H01L 23/552; H01L 23/293; H01L 23/3171; H01L 23/3185; H01L 27/14818
USPC ........................................................ 257/434
See application file for complete search history.

(56) References Cited

U.S. PATENT DOCUMENTS

| | | | |
|---|---|---|---|
| 11,756,973 B2 * | 9/2023 | Hsu | ................... H01L 27/14618 257/434 |
| 2008/0211045 A1 | 9/2008 | Ono | |
| 2016/0322273 A1 | 11/2016 | Wu et al. | |
| 2018/0114804 A1 | 4/2018 | Hsieh | |
| 2019/0096938 A1 | 3/2019 | Hsieh | |

* cited by examiner

ANTI-FLARE SEMICONDUCTOR PACKAGES AND RELATED METHODS

CROSS REFERENCE TO RELATED APPLICATIONS

This application is a continuation application of the earlier U.S. Utility patent application to Shou-Chian Hsu entitled "Anti-Flare Semiconductor Packages and Related Methods," application Ser. No. 17/305,616, filed Jul. 12, 2021, now pending, which application is a continuation application of the earlier U.S. Utility patent application to Shou-Chian Hsu entitled "Anti-Flare Semiconductor Packages and Related Methods," application Ser. No. 16/456,917, filed Jun. 28, 2019, now issued as U.S. Pat. No. 11,063,078, the disclosures of each of which are hereby incorporated entirely herein by reference.

BACKGROUND

1. Technical Field

Aspects of this document relate generally to semiconductor packages, such as complementary metal oxide semiconductor (CMOS) image sensor chip scale packages (CISCSPs) for consumer electronic devices such as cameras, phones, tablets, and laptops. More specific implementations involve image sensor packages having lids.

2. Background

Complementary metal-oxide-semiconductor (CMOS) image sensor chip scale packages (CISCSP) have a broad range of applications due to their small/thin form and low overall cost. Current CISCSPs include a transparent glass covering the entire chip.

SUMMARY

Implementations of semiconductor packages may include: a semiconductor die having a first side and a second side. A first side of an optically transmissive lid may be coupled to the second side of the semiconductor die through one or more dams. The packages may also include a light block material around the semiconductor package extending from the first side of the semiconductor die to a second side of the optically transmissive lid. The package may include an opening in the light block material on the second side of the optically transmissive lid that substantially corresponds with an active area of the semiconductor die.

Implementations of semiconductor packages may include one, all, or any of the following:

The second side of the optically transmissive lid may include an indentation on each of a first edge and a second edge of the optically transmissive lid.

The light block material may be a molding compound.

The semiconductor package may include a redistribution layer coupled to the first side of the semiconductor die.

The opening may correspond with a pixel array in the semiconductor die.

The semiconductor package may further include one or more die pads coupled to each of the one or more dams.

The semiconductor package may further include one or more die pads coupled to each of the one or more dams.

The semiconductor package may further include a plurality of through silicon vias (TSVs), a passivation layer, a solder mask, and two or more solder bumps.

Implementations of semiconductor packages may include: a semiconductor die having a first side and a second side and a first side of an optically transmissive lid coupled to the second side of the semiconductor die through one or more dams. A second side of the optically transmissive lid may include a first recess and a second recess on a first edge and a second edge of the optically transmissive lid, respectively. The package may also include a light blocking material encapsulating the semiconductor package from a first side of the semiconductor die into the first recess and into the second recess on the second side of the optically transmissive lid.

Implementations of semiconductor packages may include one, all, or any of the following:

The semiconductor package may further include an opening in the light blocking material. The opening may be between the first recess and the second recess on the second side of the optically transmissive lid.

The light block material may be a molding compound.

The semiconductor package may further include a redistribution layer (RDL) coupled to a first side of the semiconductor die.

An active area of the semiconductor die may correspond with the first recess and the second recess in the optically transmissive glass lid.

The semiconductor package may further include one or more die pads coupled to each of the one or more dams.

The semiconductor package may further include a plurality of through silicon vias (TSVs), a passivation layer, a solder mask, and two or more solder bumps.

Implementations of semiconductor packages may be formed using implementations of methods for forming semiconductor package, the methods may include: providing an optically transmissive lid having a first side and a second side. The optically transmissive lid may include a plurality of recesses on the second side of the optically transmissive lid. The method may also include coupling a semiconductor wafer to the first side of the optically transmissive lid. The semiconductor wafer may include a first side and a second side. The second side of the wafer may include a plurality of active areas. The method may also include singulating the semiconductor wafer and the optically transmissive lid between each of the plurality of active areas in the wafer to form a plurality of semiconductor packages. The method may include coupling the second side of the optically transmissive lids of each of the semiconductor packages to a carrier wafer. The recesses on the optically transmissive lid may form a space between the carrier wafer and the optically transmissive lids. The method may include applying light blocking material to each of the semiconductor packages. The light blocking material may encapsulate each of the semiconductor packages from a first side of the package into and including the recesses on the optically transmissive lid. The method may include singulating through the light blocking material to form a plurality of encapsulated semiconductor packages. The recesses may be on a first edge and a second edge of each of the optically transmissive lids around an opening in the light blocking material.

Implementations of methods of forming semiconductor packages may include one, all, or any of the following:

The method may include forming the plurality of recesses on the second side of the optically transmissive lid through one of etching or laser ablation.

The light blocking material may include a molding compound.

The method may further include forming a plurality of through silicon vias (TSVs), a passivation layer, a redistribution layer, a solder mask, and coupling solder bumps to each of the semiconductor packages.

An opening in the light blocking material on each of the plurality semiconductor packages may correspond with an active area in the semiconductor die.

The method may further include coupling dam material to the optically transmissive lid.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
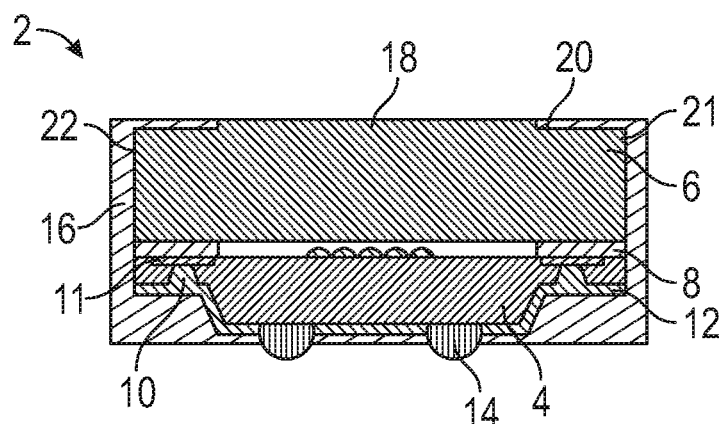
FIG. 1 is a cross sectional view of an implementation of a semiconductor package.

In various image sensor implementations, a transparent or translucent material is employed to cover the area of the image sensor die that is exposed to light. The transparent or translucent material of the cover or lid can allow light to enter package outside the sensor area which can result in flare being observed in the output from the image sensor. Referring to FIG. 1, an implementation of a semiconductor package 2 is illustrated. The semiconductor package includes a semiconductor die 4 coupled with an optically transmissive lid 6. The second side of the semiconductor die 4 is coupled to the first side of the optically transmissive lid 6. In various implementations, the optically transmissive lid 6 may include, by non-limiting example, glass, polycarbonate, acrylic, plastics, or other materials that allow some or all of a desired wavelength of light to pass through the material. In various implementations, the optically transmissive lid may be coupled to the semiconductor die through an adhesive material. In various implementations, the adhesive may include, by non-limiting example, epoxy, resin, polymers, glue, solders, and other adhesive materials used in coupling components of semiconductor devices. In some implementations, the adhesive may include silver or other metal fillers to create electrical conductivity for the adhesive. In some implementations, a dam 8 is coupled between the optically transmissive lid 6 and the semiconductor die 4. The dam may create a gap between the lid and the active area of the semiconductor die. In various implementations, the dam material may include, by non-limiting example, liquid epoxy, silicone, or other encapsulants that provide device protection, reduce warpage, demonstrate excellent flow, offer good adhesion to multiple substrates and have the strength to handle over-molding and subsequent process steps.

Still referring to FIG. 1, the semiconductor package 2 also includes two through silicon vias (TSVs) 10 extending from a first side of the semiconductor die to a die pad 11 on the second side of the semiconductor die 4. Coupled to the first side of the semiconductor die 4 is a redistribution layer (RDL) 12 extending from a first edge of the semiconductor die 4 to a second edge of the semiconductor die 4. A ball grid array 14 is coupled to the first side of the semiconductor die 4 and is surrounded by the RDL 12.

Figure 2:
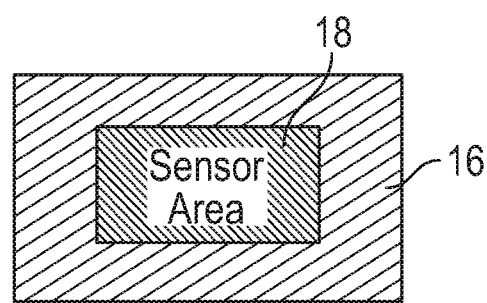
FIG. 2 is a top view of an implementation of a semiconductor package.

As illustrated, a light blocking material/masking material 16 surrounds the semiconductor package 2 extending from the first side of the semiconductor die 4 to a second side of the optically transmissive lid 6. The light blocking material 16 does not fully encapsulate the semiconductor package. As illustrated in FIG. 2, an opening 18 in the light blocking material 16 exists on the second side of the optically transmissive lid 6 that substantially corresponds with the active area of the semiconductor die (image sensor array). In various implementations, the light blocking material may be a molding compound. In other implementations, the light blocking material may include other materials that are capable of blocking light at any desired frequency from entering through the sides of the optically transmissive lid such as epoxies, resins, or polymers.

The light blocking material may be capable of ensuring no light enters the package from non-sensor areas of the semiconductor package. Blocking light from entering non-sensor areas may prevent flare. Flare may degrade the performance of the image sensor. Flare occurs when light bounces off metal pieces/structures in the semiconductor packages and into the sensor of the image sensor die. For example, metal structures may be exposed in the die streets of a semiconductor die after singulation. Without light blocking material around the sides of an optically transmissive lid, light may enter the lid from many angles and may reflect off the metal in the die streets. The stray light may enter directly on a side of the lid, hit the metal structures, reflect around within the lid and then hit the sensor of the die. Applying light blocking material around the edges of the optically transmissive lid results in a structure where light may only enter the portion of the optically transmissive lid that corresponds with the sensor or pixels of the semiconductor package thereby preventing light from reaching any metal structures within the semiconductor package. As a result of eliminating or substantially eliminating reflections from metal structures within the package, flare and the resulting image degradation caused by flare also prevented.

As illustrated, the second side of the optically transmissive lid 6 has indentations 20 on each of a first edge 21 and a second edge 22 of the lid 6. The light blocking material 16 may fill these indentations and the indentations 20 may prevent the light blocking material 16 from entering the opening 18. Referring to FIG. 2, a top view of the opening 18 surrounded by the light blocking material 16 is illustrated. The opening 18 may correspond with a pixel array in the semiconductor die.

Figure 3:
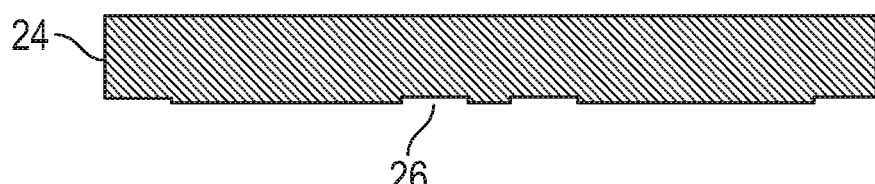
FIG. 3 is a side view of an implementation of an optically transmissive lid.

Referring to FIG. 3, a cross sectional view of an optically transmissive lid 24 is illustrated. The optically transmissive lid 24 includes a plurality of recesses 26 formed on a first side of the lid. In some implementations, the plurality of recesses may be pre-formed in the optically transmissive lid. In other implementations, the plurality of recesses 26 may be formed through etching or laser ablation in combination with various patterning methods (such as photolithography). In various implementations, the etching may include wet etching or dry etching. Various implementations of methods of manufacturing semiconductor packages as described herein may be used including wafer level processes and panel level processes. Panel level processes may have cost and productivity advantages. Panel level processing may allow for parallel processing of more units of semiconductor packages in a given period compared with wafer level processes. Panel level processing may also reduce waste that results from processing partial die in a wafer level process. A method for forming a semiconductor package may include providing an optically transmissive lid as illustrated in FIG. 3. In various implementations, the optically transmissive lid may include, by non-limiting example, glass, polycarbonate, acrylic, plastics, or other materials that allow some or all of a desired wavelength of light to pass through the material.

Figure 4:
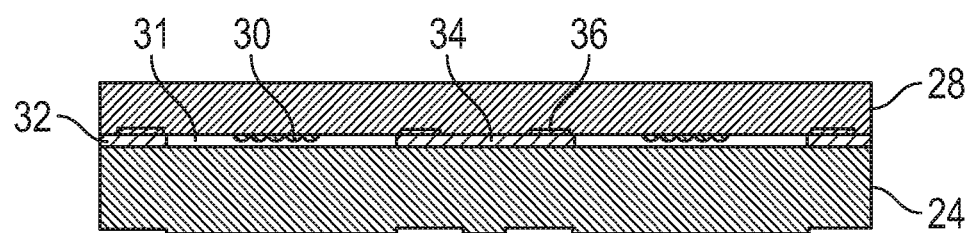
FIG. 4 is a side view of an implementation of an implementation of a semiconductor wafer coupled with an implementation of an optically transmissive lid.

The method may further include coupling a semiconductor wafer to a first side of the optically transmissive lid. The semiconductor wafer may include a plurality of active areas on a second side of the wafer. In various implementations, the active areas may include pixel arrays. Referring to FIG. 4, a semiconductor wafer 28 coupled to an optically transmissive lid 24 is illustrated. The plurality of active areas 30 are enclosed in a gap 31 between the semiconductor material 28 and the optically transmissive lid 24. Dams 34 on either side of each of the plurality of active areas 32 helps to form the gaps 31. In various implementations, the dams 34 may be coupled to die pads 36 in the semiconductor wafer 28 on either side of the active areas 30.

Figure 5:
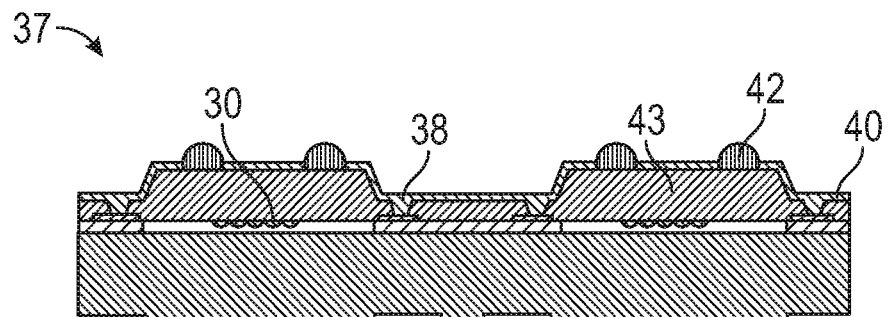
FIG. 5 is side view of a panel of an implementation of a semiconductor packages after various processing steps.

Referring to FIG. 5, an implementation of a panel 37 of semiconductor packages is illustrated. In various implementations, the panel may be processed using a standard chip scale package process. For example, the method may include forming a plurality of through silicon vias (TSVs) 38 through the first side of the semiconductor wafer on either side of the active area 30. The TSVs may be formed through drilling, etching, or other methods of forming a hole through a semiconductor die. The method may also include forming a passivation layer and RDL 40 over the plurality of semiconductor die 43. The method may also include forming a solder mask and coupling a plurality of balls 42 to form a ball grid array (BGA) to the first side of the semiconductor die 43. In various implementations, different surface mount interconnects such as, by non-limiting example, pillars, stud bumps, and any other interconnect type may be used. In some implementations, the interconnects may be formed of copper, solder, or other electrically conductive materials.

Figure 6:
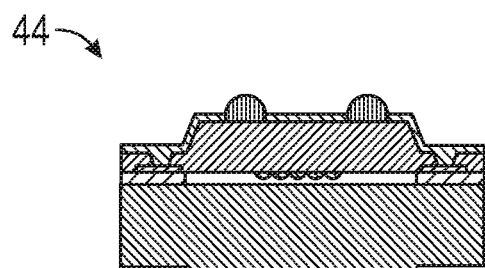
FIG. 6 is a cross sectional view of a semiconductor package after singulation.
Figure 7:
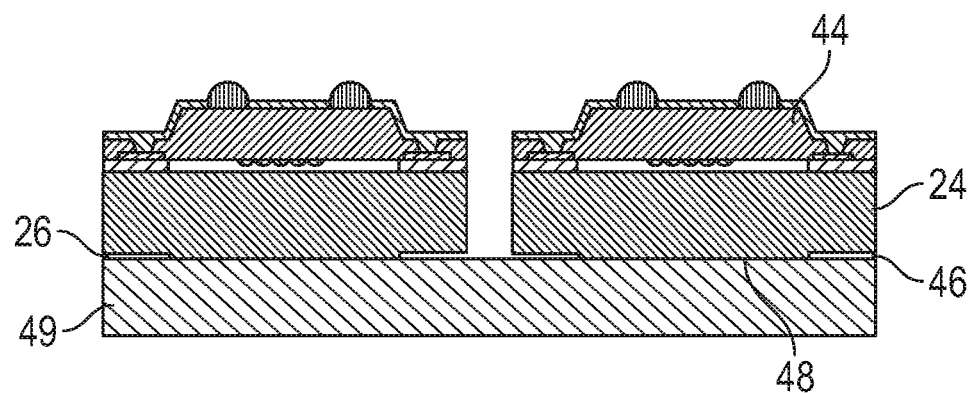
FIG. 7 is a cross sectional view of an implementation of two semiconductor packages coupled with an implementation of a carrier wafer.

The method may also include singulating the semiconductor wafer and the optically transmissive lid between each of the plurality of active areas in the wafer to form a plurality of semiconductor packages. The packages may be singulated through sawing or dicing. Referring to FIG. 6, an implementation of a semiconductor package 44 after singulation is illustrated. The method also includes coupling each of the semiconductor packages to a carrier wafer. The second side of the optically transmissive lids 48 of each of the semiconductor packages 44 is coupled to the carrier wafer 49 as illustrated in FIG. 7. In various implementations, the semiconductor packages may be coupled to the carrier wafer through a pick and place process. Recesses are located on the first edge and the second edge of each of the optically transmissive lids. As illustrated, the recesses 26 on the second side of each of the optically transmissive lids 24 form a space 46 between the carrier wafer 49 and the optically transmissive lids 24. The space is then filled with light blocking material allowing the light blocking material to encapsulate each of the packages and leave an opening on the second side of the optically transmissive lid. In various implementations, the opening is sized to expose only a sensor area of the semiconductor die. In other implementations, the opening may be sized to substantially expose only a sensor area of the semiconductor die.

Figure 8:
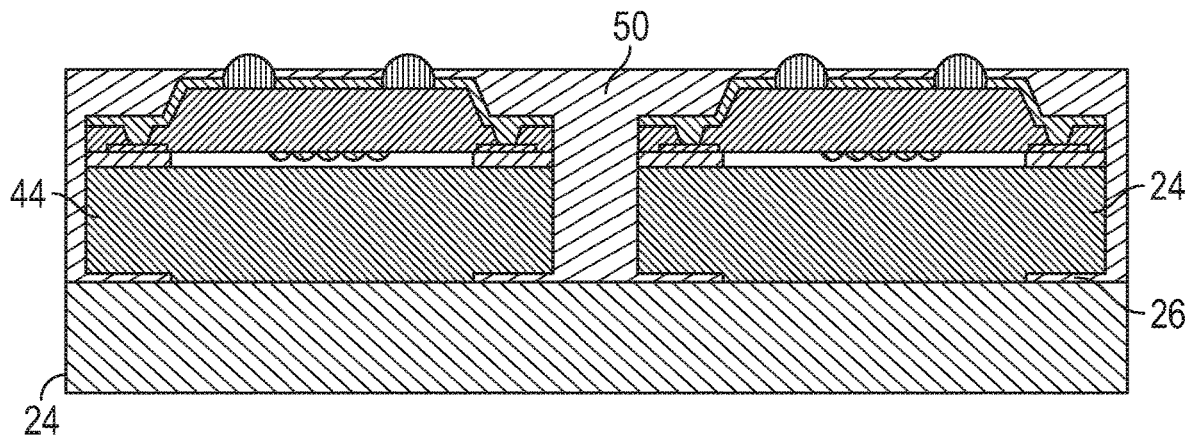
FIG. 8 is a cross sectional view of an implementation of two semiconductor packages after encapsulation with an implementation of a light blocking material.

Referring to FIG. 8, the plurality of semiconductor packages 44 are illustrated after applying light blocking material 50 to each of the semiconductor packages. As previously described, the light blocking material 50 encapsulates each of the semiconductor packages from a first side of the packages into and including the recesses 26 on the optically transmissive lids 24. In various implementations, the light blocking material 50 may include a molding compound. In various implementations, the molding compound may include, by non-limiting example, epoxies, resins, polymers, solders, and other materials that may used to seal a die to a lid of a semiconductor package.

The light blocking material may prevent stray light from entering the active area of the semiconductor die by preventing light from entering the semiconductor packages on the sides of the optically transmissive lid. In various implementations, the method also includes singulating through the light blocking material to form a plurality of encapsulated semiconductor packages. The semiconductor packages may be singulated through sawing or dicing.

Figure 9:
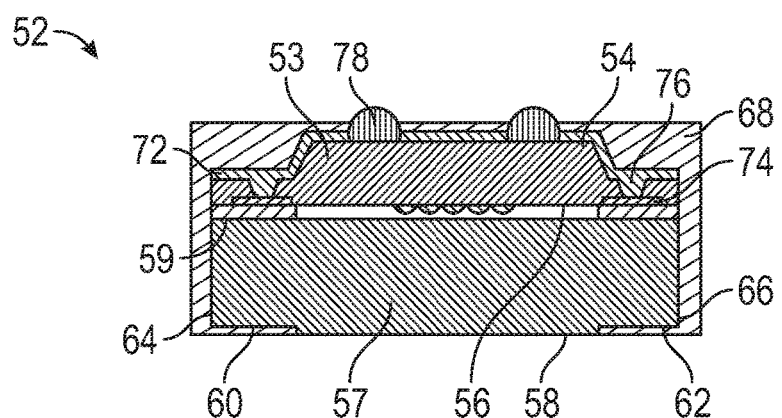
FIG. 9 is a cross sectional view of an implementation of a semiconductor package after singulation.

Referring to FIG. 9, an implementation of a semiconductor package 52 is illustrated. The package includes a semiconductor die 53 coupled to an optically transmissive lid 57. The semiconductor die 53 includes a first side 54 and a second side 56. The second side 56 of the semiconductor die 53 includes an active area including a pixel array. The second side 56 of the die 53 is coupled to the first side 59 of the optically transmissive lid 57. In various implementations, the die and the lid may be coupled through adhesive material. By non-limiting example, the adhesive material may include epoxy, resin, polymers, glue, and other adhesive materials used in coupling components of semiconductor devices. In other implementations, the die and the lid may be coupled through dams. The dams may be formed of any of the materials previously mentioned herein. The dam creates a gap between the semiconductor die 53 and the optically transmissive lid 57.

A second side 58 of the optically transmissive lid 57 may include a first recess 60 and a second recess 62 on a first edge 64 and a second edge 66 of the optically transmissive lid 57.

Figure 10:
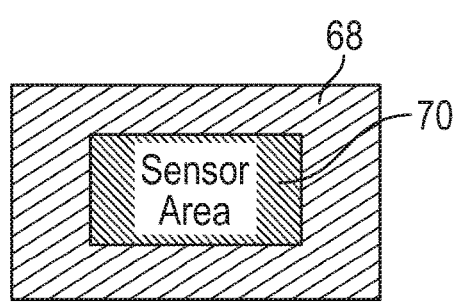
FIG. 10 is a top view of an implementation of a top of a semiconductor package as described herein.

The semiconductor package 52 also includes a light blocking material 68 encapsulating the semiconductor package from a first side of the semiconductor die into the first recess 60 and into the second recess 62 on the second side of the lid. Referring to FIG. 10, the opening 70 in the light blocking material 68 is sized to expose only, or substantially only, the sensor area of the semiconductor die. The size of the opening may prevent stray light from entering the sensor area in the active area of the semiconductor die. In various implementations, the light blocking material may include a molding compound. As previously described, the light blocking material may include other materials that are capable of blocking visible light from entering through the sides of the optically transmissive lid in other implementations. The light blocking material may be capable of ensuring no light enters the package from non-sensor areas of the semiconductor package. Blocking light from entering non-sensor areas may prevent flare and enhance image quality.

Referring again to FIG. 9, the semiconductor package also includes a redistribution layer (RDL) 72 coupled to the first side of the semiconductor die 53. The RDL 72 is coupled to die pads 74 through a plurality of through silicon vias (TSVs) 76. As illustrated, the die pads are located on either side of the active area of the image sensor die. The semiconductor package also includes a passivation layer, a solder mask, and two solder bumps 78 on the first side of the semiconductor die 53. In some implementations, more than two bumps may be coupled to a first side of the semiconductor die.

Implementations of semiconductor packages described herein may have high reliability due to protection/molding being present on 6 sides of the semiconductor package. The light blocking material and related processes may be used in other implementations of image sensor packages such as, by non-limiting example, charge-coupled devices (CCD), complementary metal-oxide-semiconductor (CMOS) or N-type metal-oxide-semiconductor (NMOS, Live MOS) packages. It might be advantageous to apply light blocking material to any semiconductor package including an optically transmissive lid to prevent unwanted light from entering the package.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a semiconductor die comprising a first side and a second side;
   a first side of an optically transmissive lid coupled to the second side of the semiconductor die;
   a light block material comprised around the semiconductor package extending from the first side of the semiconductor die to a second side of the optically transmissive lid; and
   an opening in the light block material on the second side of the optically transmissive lid;
   wherein the light block material covers a portion of the second side of the optically transmissive lid and a portion of the first side of the semiconductor die.

2. The semiconductor package of claim 1, wherein the second side of the optically transmissive lid comprises an indentation on each of a first edge and a second edge of the optically transmissive lid.

3. The semiconductor package of claim 1, wherein the light block material is a molding compound.

4. The semiconductor package of claim 1, further comprising a redistribution layer coupled to the first side of the semiconductor die.

5. The semiconductor package of claim 1, wherein the opening corresponds with a pixel array in the semiconductor die.

6. The semiconductor package of claim 1, further comprising one or more die pads coupled to one or more dams.

7. The semiconductor package of claim 1, further comprising a plurality of through silicon vias (TSVs), a passivation layer, a solder mask, and two or more bumps.

8. A semiconductor package comprising:
   a semiconductor die comprising a first side and a second side;
   a first side of an optically transmissive lid coupled to the second side of the semiconductor die; and
   a light block material at least partially encapsulating the semiconductor package on six sides of the semiconductor package;
   wherein the light block material is coupled directly over a second side of the optically transmissive lid opposite the first side of the optically transmissive lid.

9. The semiconductor package of claim 8, further comprising an opening in the light block material, wherein the optically transmissive lid is exposed through the opening.

10. The semiconductor package of claim 8, wherein the light block material is a molding compound.

11. The semiconductor package of claim 8, further comprising a redistribution layer (RDL) coupled to the first side of the semiconductor die.

12. The semiconductor package of claim 8, wherein an active area of the semiconductor die corresponds with a first recess and a second recess in the optically transmissive lid.

13. The semiconductor package of claim 8, further comprising one or more die pads coupled to one or more dams.

14. The semiconductor package of claim 8, further comprising a plurality of through silicon vias (TSVs), a passivation layer, a solder mask, and two or more bumps.

15. A semiconductor package comprising:
   a semiconductor die comprising a first side and a second side;
   a first side of an optically transmissive lid coupled to the second side of the semiconductor die;
   a light block material at least partially covering each side of the semiconductor package; and
   an opening in the light block material on the second side of the optically transmissive lid that substantially corresponds with an active area of the semiconductor die.

16. The semiconductor package of claim 15, wherein the light block material is a molding compound.

17. The semiconductor package of claim 15, further comprising a redistribution layer coupled to the first side of the semiconductor die.

18. The semiconductor package of claim 15, wherein the opening corresponds with a pixel array in the semiconductor die.

19. The semiconductor package of claim 15, further comprising one or more dams coupled between the optically transmissive lid and the semiconductor die.

20. The semiconductor package of claim 15, further comprising a plurality of through silicon vias (TSVs), a passivation layer, a solder mask, and two or more bumps.

\* \* \* \* \*